United States Patent
Kowalski et al.

(10) Patent No.: US 6,838,724 B2
(45) Date of Patent: Jan. 4, 2005

(54) TRANSISTOR ARRAY AND SEMICONDUCTOR MEMORY CONFIGURATION FABRICATED WITH THE TRANSISTOR ARRAY

(75) Inventors: Bernhard Kowalski, München (DE); Andreas Felber, München (DE); Valentin Rosskopf, Pöttmes (DE); Till Schlösser, Dresden (DE); Jürgen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/718,310

(22) Filed: Nov. 20, 2003

(65) Prior Publication Data

US 2004/0104418 A1 Jun. 3, 2004

(30) Foreign Application Priority Data

Nov. 20, 2002 (DE) .......................................... 102 54 160

(51) Int. Cl.$^7$ ............................................ H01L 27/108
(52) U.S. Cl. ......................... 257/302; 257/300; 257/304
(58) Field of Search ................................. 257/302, 300, 257/304

(56) References Cited

U.S. PATENT DOCUMENTS

| 5,519,236 | A | | 5/1996 | Ozaki ........................... 257/302 |
| 6,344,390 | B1 | * | 2/2002 | Bostelmann et al. ....... 438/249 |
| 6,515,327 | B1 | * | 2/2003 | King ........................... 257/304 |
| 2002/0127796 | A1 | | 9/2002 | Hofmann et al. |
| 2002/0127803 | A1 | | 9/2002 | Schlosser et al. |

FOREIGN PATENT DOCUMENTS

| DE | 101 11 755 C1 | 5/2002 |
| DE | 101 25 967 C1 | 7/2002 |
| DE | 101 11 760 A1 | 10/2002 |

* cited by examiner

Primary Examiner—David Nelms
Assistant Examiner—Tu-Tu Ho
(74) Attorney, Agent, or Firm—Laurence A. Greenberg; Werner H. Stemer; Gregory L. Mayback

(57) ABSTRACT

A transistor array has vertical FET transistors each connected to a storage capacitor of a memory cell array. Gate electrode strips, which form word lines, of the transistors are located on both sides of active webs running parallel to one another and are connected to a superimposed metal plane by word line or CS contacts. To insulate these word line contacts from the other elements of the transistor array and of the cell array, the word line contacts are located in deep trenches that are introduced into the webs.

12 Claims, 4 Drawing Sheets

FIG 2
PRIOR ART
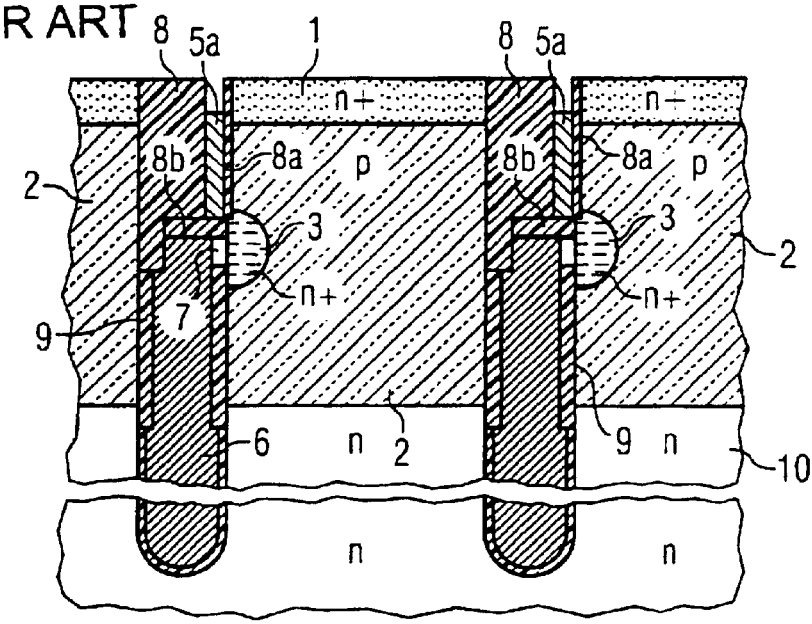
FIG 3
PRIOR ART
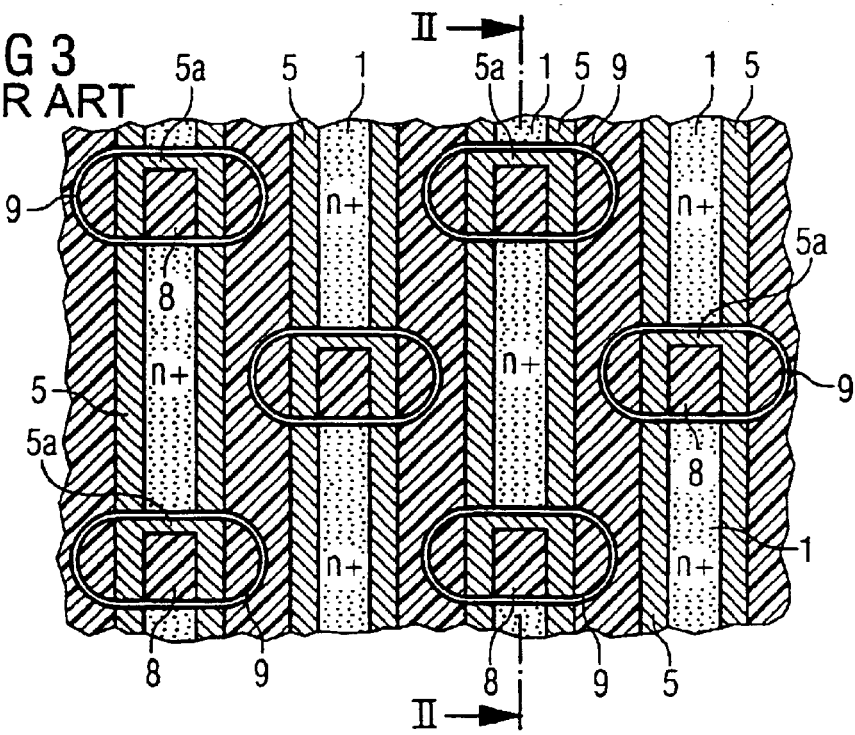
|  Gate |  p-Region |  Isolation/Dielectric |
|---|---|---|
|  Webs (AT) (Source-Region) |  Poly-Si |  Drain-Region |

Section B-B

- A T
- Gate/WL
- Trench (Layout)
- M O
- WL-Contact to M O
- Isolation
- Poly-Si

TRANSISTOR ARRAY AND SEMICONDUCTOR MEMORY CONFIGURATION FABRICATED WITH THE TRANSISTOR ARRAY

BACKGROUND OF THE INVENTION

Field of the Invention

The invention lies in the semiconductor technology and memory technology fields. More specifically, the invention relates to a transistor array comprising vertical FET transistors, which are each designed in the form of vertical sections, running parallel in the lateral direction, of active webs formed from semiconductor regions into the depth of a substrate, and in which a channel region is surrounded by gate strips which form the gate electrodes, run along the active web sections and at the same time form word lines for an array of semiconductor memory cells assigned to the transistor array, word line contacts electrically connecting at least some of the word lines to metal tracks of a metal plane superimposed on the transistor array. The invention also relates to a semiconductor memory configuration fabricated therewith, in particular a DRAM memory.

A transistor array having the above-mentioned features is described in U.S. Pat. No. 5,519,236.

The ongoing trend toward ever smaller semiconductor memory configurations, such as DRAMs, has led to the storage capacitors of the memory cells and the associated transistors being built as vertical elements into the depth of the semiconductor substrate. This allows the vertically formed FET transistors to make a contribution to realizing semiconductor memory configurations with a memory cell geometry of F=70 nm and below while at the same time allowing the performance of the vertical FET transistors to be maintained.

For this purpose, silicon-filled, parallel active webs were formed in a corresponding process in a width of 0.5–1 F, with the bulk, source, and drain electrodes of the vertical FET transistors located therein. At the end sides, these active webs are in each case delimited by deep trenches. At the top side of the deep trenches is polysilicon encapsulated by insulating material or insulating material alone. At the two sides of each active web there are gate strips which form a gate electrode of each transistor, are themselves formed by a vertically etched spacer and for their part serve as a word line for the associated semiconductor memory cells. The thickness of the word line is approximately 0.2 F and its vertical dimension is approximately 5 F. The upper end of the word line spacers is located a few tens of nm below the top side of the active web. Gate contacts, known as CS contacts, produce contact to the word line. To produce the CS contacts, the active web is provided with a very small cutout transversely to the running direction of the active web. This cutout reduces the vertical height of the active web and the contact to the word line is produced at this location.

The problem in this context is that the word line contacts and the word lines have to be electrically insulated from the active web and from other regions or elements of the transistor array and/or the semiconductor memory cells, so that, for example, it is also possible for negative voltages to be applied to the word line. It is not possible for the word line to be spatially separated from the active webs in order for example to produce a contact. The reason for this is that the word lines are fabricated without their own mask level and are coupled to the active webs.

SUMMARY OF THE INVENTION

It is accordingly an object of the invention to provide a transistor array and a semiconductor memory device formed with the transistor array which overcomes the above-mentioned disadvantages of the heretofore-known devices and methods of this general type and which provides for a structure for insulating the word line contacts or CS contacts and the word lines from the remaining regions of the transistor array or of the associated semiconductor memory cell array.

With the foregoing and other objects in view there is provided, in accordance with the invention, a transistor array, comprising:

vertical FET transistors each formed of vertical and laterally parallel sections of active webs of semiconductor formed into a depth of a substrate;

said vertical FET transistors having a channel region surrounded by gate strips, forming a gate electrode and running along said sections of active webs, and forming word lines for a memory cell array of semiconductor memory cells assigned to the transistor array; and word line contacts electrically connecting at least some of said word lines to metal tracks of a metal plane superimposed on the transistor array.

According to a first aspect of this invention, the word line contacts are each insulated from the other elements by an insulation provided in a deep trench which passes into the depth of the active web, the deep trenches being formed with the same structure as the deep trenches which otherwise form storage capacitors in the array of the semiconductor memory cells, with the exception of a buried strap which connects the active web in the memory cell array to polysilicon located in the depth of the substrate and which is omitted in the deep trenches of the word line contacts. Accordingly, at this deep trench which includes the word line contact, the buried strap, which functions as a drain contact in the memory cell array, between the polysilicon located at a low level and the active web is omitted, so that the deeper region of the deep trench at the word line contact does not function as a capacitor, unlike in the memory cell array. Consequently, there is no need for new masks or structures in the process for producing the word line contacts.

The deep trench is preferably filled with insulating material beneath the word line contact.

According to a second aspect of the invention, in which the transistor array together with the memory cell array of the semiconductor memory cells is arranged in a common first semiconductor well in the substrate, all the word lines lead, by means of the word line contacts or CS contacts to the metal plane, into a separate second semiconductor well which is insulated from the first semiconductor well and is of the same conduction type, where they are in contact with the metal tracks of the metal plane by means of the word line contacts.

According to a preferred exemplary embodiment of this transistor array, the active webs inside the second semiconductor well, which bear the word lines on both sides, are insulated from the corresponding web sections outside the second semiconductor well by oxide-encapsulated columns inside deep trenches, which pass through the webs, which are formed at the interface between the second semiconductor well and a surrounding semiconductor region of the opposite conduction type, the deep trenches being formed with the same structure as the deep trenches which otherwise form storage capacitors in the array of the semiconductor memory cells, with the exception of a buried strap which connects the active web in the memory cell array to polysilicon which lies in the depth of the substrate and which is omitted in the deep trenches at the interface between the second semiconductor well and the surrounding semiconductor region of the opposite conduction type.

In this preferred exemplary embodiment, the FET transistors may be n-channel transistors, in which case the first and second semiconductor wells are of the p type. The proposed structure of the transistor array may be designed in such a way that the thickness of the active webs which form the semiconductor regions is 0.5–1 F, the length of each section of the active webs which forms an n-channel transistor is 2–3 F, the thickness of the word lines on both sides of the webs is approximately 0.2 F and their vertical depth is approximately 5 F. The feature size F in this case, for example, is 70 nm.

A preferred application of the transistor array according to the invention is a semiconductor memory configuration in which each memory cell of the memory array is assigned a vertical FET transistor of this type. A preferred semiconductor memory configuration of this type is, in particular, a DRAM memory.

Other features which are considered as characteristic for the invention are set forth in the appended claims.

Although the invention is illustrated and described herein as embodied in a transistor array and semiconductor memory configuration fabricated therewith, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a cross section taken along the line II—II through part of the structure shown in FIG. 1 into the depth of the substrate in order to illustrate the arrangement of the storage capacitors which are assigned to each transistor and are formed in vertically formed deep trenches;

FIG. 3 is a diagrammatic view of the layout of the structure shown in FIG. 2;

DESCRIPTION OF THE PREFERRED EMBODIMENTS

Before delving into the description of preferred exemplary embodiments of a transistor array according to the invention and of a semiconductor memory configuration which utilizes the novel transistor array, we provide a description of a prior art concept. Such a transistor array with vertical FET transistors with surrounding gate strip and the problems which arise therewith will now be described with reference to FIGS. 1 to 3 (cf. U.S. Pat. No. 5,519,236).

Figure 1:
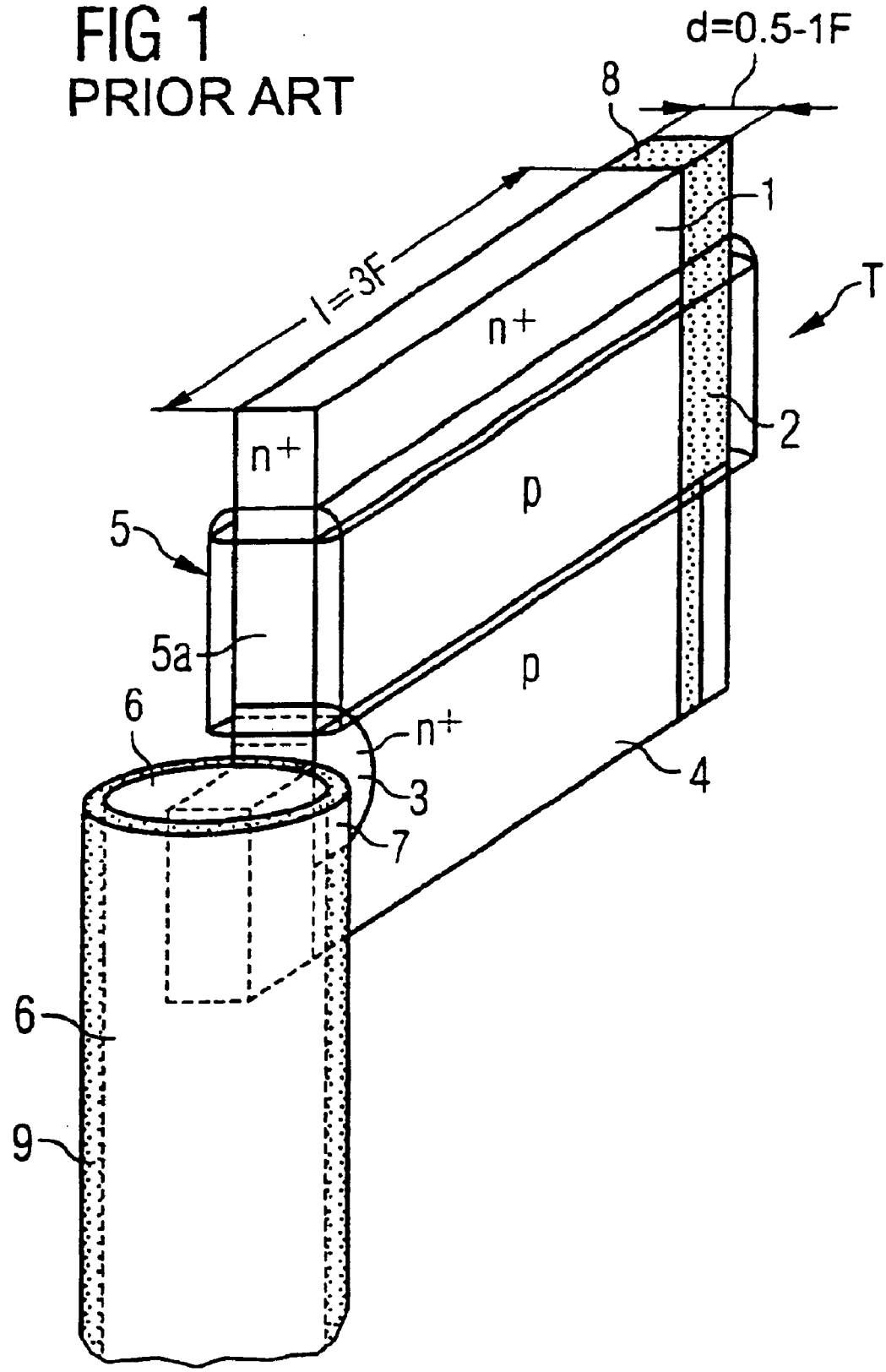
FIG. 1 is a diagrammatic and perspective view of a prior art vertical transistor structure having a gate electrode which surrounds a channel region in the form of gate strips.

The perspective illustration presented in FIG. 1 shows part of an active web which forms an individual transistor T and is formed in the vertical direction, i.e. into the depth of a semiconductor substrate 10 (FIG. 2). From the top downward, the web has an $n^+$-source region 1, a p-region 2 which forms an n-channel, an undepleted p-region or bulk region 4 and an $n^+$-drain electrode region 3. Gate electrode strips 5 run in a ring around the p-region 2, forming the n-channel, with a thin insulating layer (not shown in FIG. 1) in between, so that the gate electrode strips 5 slightly overlap, in insulated form, the $n^+$-source region 1 and the $n^+$-drain region 3.

The part of the web which forms this vertical FET transistor has a length L=2–3 F and a thickness d of between 0.5 and about 1 F; F may, for example, be 70 nm or less. Insulating sections 8 and 9 are represented by dots in FIG. 1. FIG. 1 also shows part of a deep trench in which a storage capacitor is formed, represented by a capacitor electrode 6 and an insulating dielectric 9. The capacitor electrode 6 of the storage capacitor, which consists, for example, of polysilicon or a suitable metal, is in contact with the $n^+$-drain electrode 3 via a conducting section 7.

FIG. 2 shows a cross section through the FET transistor structure illustrated in perspective in FIG. 1, through the active web forming the active semiconductor regions, the figure illustrating two adjacent vertical FET transistors. It is clearly apparent from FIG. 2 that the storage capacitors formed by the deep trenches extend deep into the substrate 10 in order to generate a sufficient capacitance. Furthermore, FIG. 2 shows insulating oxide layers 8, 8a, 8b in each case between end-side sections 5a of the surrounding gate electrode strips 5 and the p-region 2 forming the n-channel and the drain electrode 3, on the one hand, and with respect to the conducting capacitor electrode section 6, on the other hand.

Finally, FIG. 3 diagrammatically depicts the layout of the structure shown in FIG. 2, illustrating the parallel arrangement of the active webs (shown from above through the $n^+$-source electrode regions 1) and the offset arrangement of the vertical FET transistors in the active webs, on the one hand, and the storage capacitors formed between each transistor, represented by ovals which indicate the deep trenches 9, on the other hand.

In principle, contact can be made with the gate electrode strip 5 which forms the word line through what are known as CS contacts or word line contacts at any location of the web.

However, it is clearly apparent from FIGS. 2 and 3 that it is not possible to produce a satisfactory and permanent insulation between word line contacts or CS contacts positioned in this manner and active web. The word lines and the word line contacts have to be insulated not only from the active web but also from any extensive areas of the memory cell arrangement. Furthermore, the capacitance of the word line or the word line contact has to be kept as low as possible with respect to the active web and with respect to everything connected to the web. It should be noted that in principle the drain electrode 3 and source electrode 1 can be swapped over in electrical terms.

Furthermore, it is intended for it to be possible for the voltages applied to the word line (e.g. negative voltages) to differ from the other voltages at the memory cell.

The following text describes structures in accordance with the invention which solve the above problems and create low-capacitance word line contacts which are reliably electrically insulated from the other regions of the configuration in such a way that they can be connected without problems to a metalization level above. Only with this insulation can negative voltages be applied to the word lines.

Figure 4A:
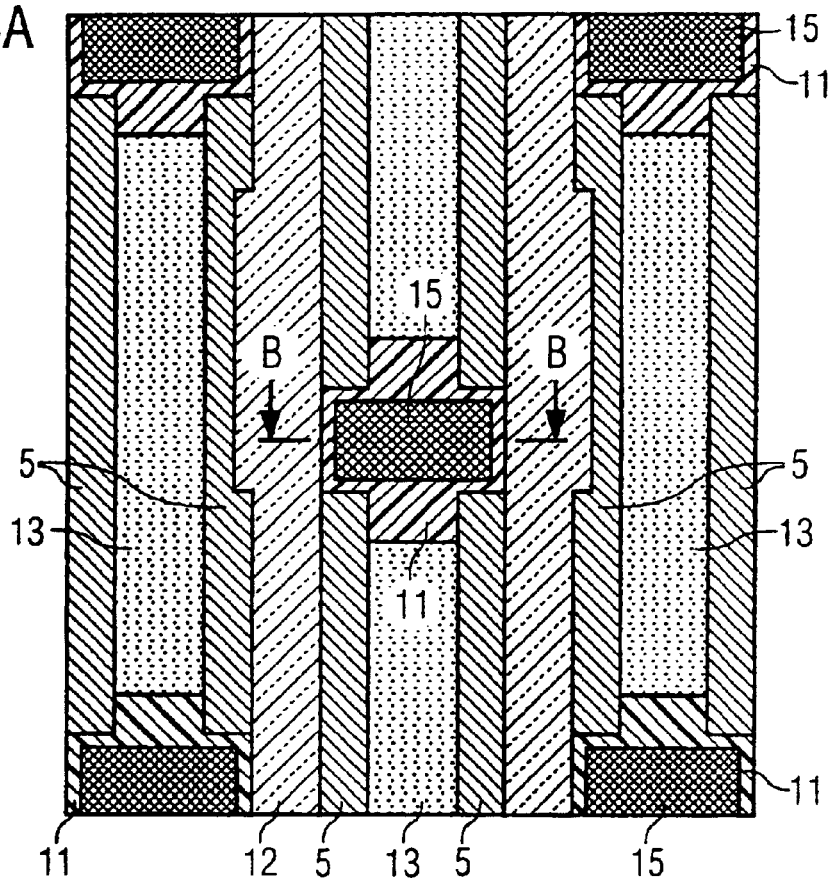
FIG. 4A is a layout view of a first exemplary embodiment of a word line contact or CS contact between the word line and the metal plane above it which is configured in accordance with the invention, illustrating the way in which the word line contact is isolated by a deep trench.
Figure 4B:
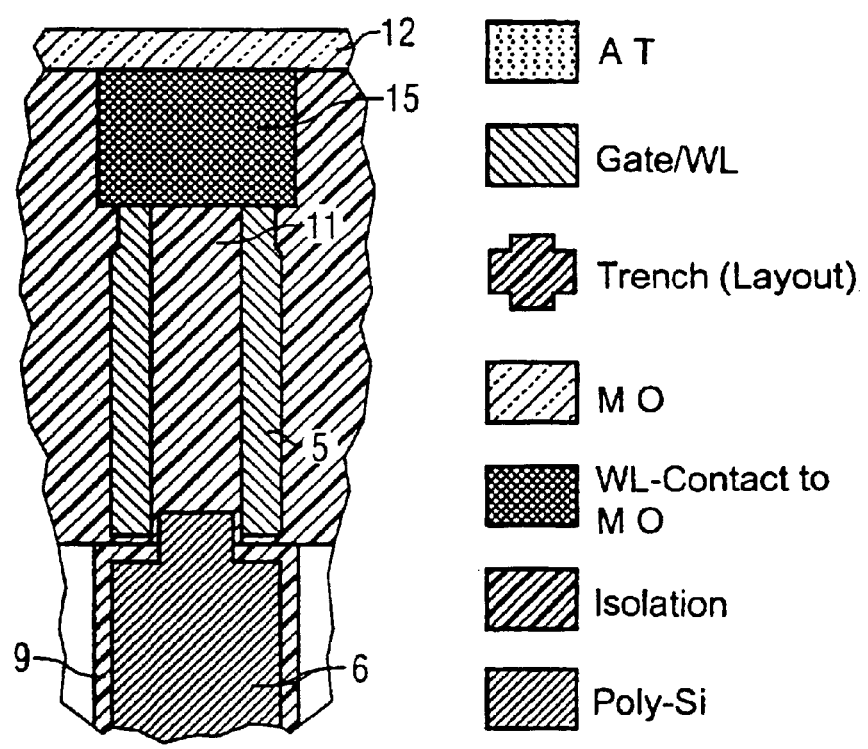
FIG. 4B is a cross section taken along the line B—B, illustrating the vertical structure of the first exemplary embodiment, shown in FIG. 4A, of the word line contact or CS contact.

FIGS. 4A and 4B each illustrate a word line contact 15 in accordance with a first exemplary embodiment of a transistor array according to the invention, respectively in the form of a diagrammatic layout view and in cross section. The layout view shown in FIG. 4A shows a metal plane 12 (M0), which, as shown in FIG. 4B, is continuous above the plane of the layout view shown in FIG. 4A, is connected to a word line contact 15 and forms the top layer illustrated. The figures further show three parallel active webs (AT) 13, gate strips 5 which run on both sides of the active webs 13 and form the word lines, and deep trenches 11. The latter are illustrated with alternating thick and thin oblique hatching and are positioned beneath the word line contacts 15 in such a way that on the one hand they allow contact to be made between the word line contacts or CS contacts 15 and the word lines 5 and on the other hand they insulate the word line contacts 15 from the remaining elements.

The cross-sectional illustration presented in FIG. 4B, which represents the process and corresponds to the section line B—B in FIG. 4A, shows that the word line contact 15 is insulated laterally and at the bottom from the web 13 by oxide at the upper end of the deep trench 11. As an alternative to oxide, it is also possible to use entirely polysilicon, in which case the insulation is produced by covering oxide which covers the deep trench 6, 9.

In this context, with regard to the above description of FIGS. 4A and 4B, it should be noted that in the section of the active web 13 which is connected to the metal plane 12 by the word line contact 15 configured according to the invention, the storage capacitor 6, 9 which is shown in FIGS. 1 and 2 and is formed in the deep trench in the manner explained above, does not function as such a capacitor, since in this case the buried strap (3 in FIG. 2), which is only present in the memory cell array, of the active web with the polysilicon located at a low level has in this case been omitted. FIG. 4B indicates, purely diagrammatically, a part of the storage capacitor which in this case has no function and is indicated by the polysilicon column 6 and its insulation 9, i.e. the process steps used to form the drain contact by means of the buried strap are omitted in the case of this deep trench, which in the case of the word line contact is used only for insulation purposes, but the other process steps are identical to those used to form the deep trench in the memory cell array.

Figure 5:
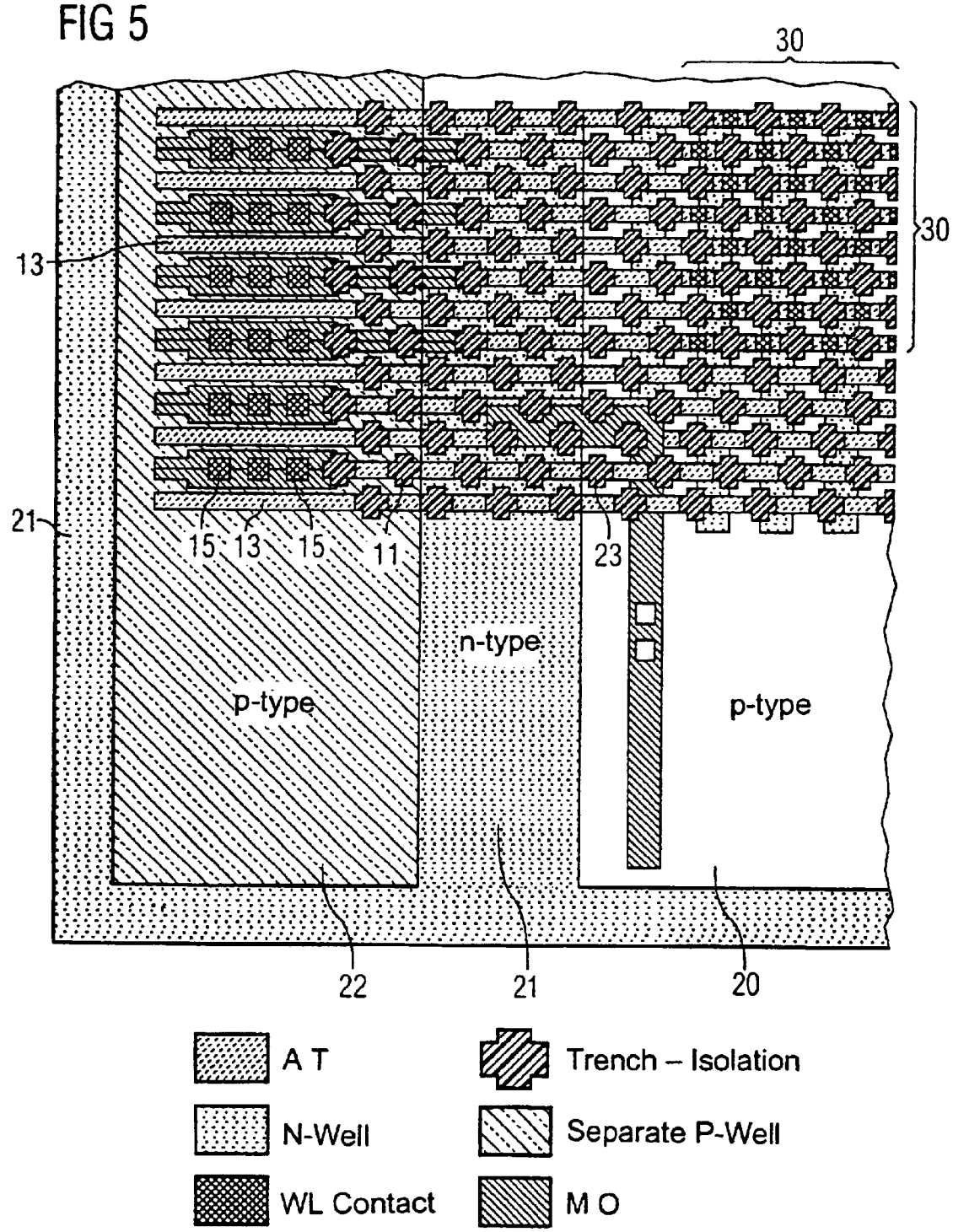
FIG. 5 is a plan layout view of a transistor and memory cell array having word line contacts in accordance with a second exemplary embodiment of the invention.

FIG. 5 shows a layout view of a second exemplary embodiment of a transistor array according to the invention in conjunction with a memory cell array 30. All the word line contacts or CS contacts 15 lie in a separate p-well 22, which is physically and electrically separated from the p-well 20 in which the memory cell array 30 is located. The two p-wells 20 and 22 are embedded in a buried n-plate 21 and are separated from one another by an n-conducting region. Oxide-encapsulated or alternatively oxide-filled columns in deep trenches 11 which pass through the webs 13 produce the insulation between the webs 13 inside the well 22 and outside it at the interface between the n-plate 21 and the p-well 22. There are no buried straps connected to these deep trenches 11.

To summarize, with the two exemplary embodiments of a transistor array according to the invention illustrated in FIGS. 4A and 4B, on the one hand, and in FIG. 5, on the other hand, it is advantageously possible to produce contact between the word lines and a metal plane MO above in a manner which is insulated from the other elements in such a way that:

a) electrical contact between the word lines and the webs supporting them as well as everything connected to the webs is avoided;

b) the capacitance between the word lines and the webs which support them and everything connected to the webs can be kept low; and c) different voltages (e.g. negative voltages) can be applied to the word lines than to the other elements of the transistor array or of the memory cell array assigned thereto.

We claim:

1. A transistor array, comprising:

vertical FET transistors each formed of vertical and laterally parallel sections of active webs of semiconductor formed into a depth of a substrate;

said vertical FET transistors having a channel region surrounded by gate strips, forming a gate electrode and running along said sections of active webs, and forming word lines for a memory cell array of semiconductor memory cells assigned to the transistor array;

word line contacts electrically connecting at least some of said word lines to metal tracks of a metal plane superimposed on the transistor array;

an insulation in a deep trench, passing into the depth of said active web, insulating said word line contacts from other elements, the deep trenches being formed with a substantially identical structure as deep trenches otherwise forming storage capacitors in the memory cell array, except for a buried strap connecting said active web in the memory cell array to polysilicon in the depth of the substrate and that is omitted in the deep trenches of the word line contacts.

2. The transistor array according to claim 1, wherein the deep trench is filled with insulating material below said word line contact.

3. The transistor array according to claim 1, wherein said FET transistors are n-channel transistors, a thickness of said webs forming the semiconductor regions is 0.5–1 F, a length of each section of said webs forming an FET transistor is 2–3 F, a thickness of said word lines is approximately 0.2 F, and a vertical depth is approximately 5 F, where F is approximately equal to 70 nm.

4. The transistor array according to claim 3, wherein the conduction type of the first and second semiconductor wells is a p type.

5. A transistor array formed together with a memory cell array of semiconductor memory cells in a common first semiconductor well of a first conduction type in a substrate, the transistor array comprising:

vertical FET transistors each formed of vertical and laterally parallel sections of active webs of semiconductor formed into a depth of a substrate;

said vertical FET transistors having a channel region surrounded by gate strips, forming a gate electrode and running along said sections of active webs, and forming word lines for the memory cell array of semiconductor memory cells formed in the common well and assigned to the transistor array;

word line contacts electrically connecting at least some of said word lines to metal tracks of a metal plane superimposed on the transistor array;

all of said word lines leading into a second semiconductor well, separate and insulated from the first semiconductor well and having the same conduction type, and said word line contacts connecting said word lines to the metal tracks of the metal plane in the second semiconductor well.

6. The transistor array according to claim 5, wherein:

said active webs inside the second semiconductor well, supporting said word lines on both sides thereof, are insulated from corresponding said web sections outside the second semiconductor well by insulating columns inside deep trenches passing through said webs at an interface between the second semiconductor well and a surrounding semiconductor region of a second conduction type;

said deep trenches being formed with a substantially identical structure as deep trenches otherwise forming storage capacitors in the memory cell array, except of a buried strap connecting an active web in the memory cell array to polysilicon lying in a depth of the substrate and being omitted in the deep trenches at the interface between the second semiconductor well and the surrounding semiconductor region.

7. The transistor array according to claim 5, wherein said FET transistors are n-channel transistors, a thickness of said webs forming the semiconductor regions is 0.5–1 F, a length of each section of said webs forming an FET transistor is 2–3 F, a thickness of said word lines is approximately 0.2 F, and a vertical depth is approximately 5 F, where F is approximately equal to 70 nm.

8. The transistor array according to claim 5, wherein the conduction type of the first and second semiconductor wells is a p type.

9. A semiconductor memory configuration, comprising a transistor array of FET transistors according to claim 1 wherein each memory cell of the memory cell array is assigned one vertical FET transistor.

10. The memory configuration according to claim 9 formed as a DRAM memory.

11. A semiconductor memory configuration, comprising a transistor array of FET transistors according to claim 5 wherein each memory cell of the memory cell array is assigned one vertical FET transistor.

12. The memory configuration according to claim 11 formed as a DRAM memory.

\* \* \* \* \*